United States Patent
Jung

(10) Patent No.: US 8,907,698 B2
(45) Date of Patent: Dec. 9, 2014

(54) ON-DIE TERMINATION CIRCUIT AND TERMINATION METHOD

(71) Applicant: SK Hynix Inc., Icheon-si Gyeonggi-do (KR)

(72) Inventor: Jong Ho Jung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 181 days.

(21) Appl. No.: 13/757,369

(22) Filed: Feb. 1, 2013

(65) Prior Publication Data

US 2014/0003185 A1 Jan. 2, 2014

(30) Foreign Application Priority Data

Jun. 27, 2012 (KR) ........................ 10-2012-0069156

(51) Int. Cl.
| | |
|---|---|
| G11C 8/00 | (2006.01) |
| H03K 17/16 | (2006.01) |
| H03K 19/003 | (2006.01) |
| G11C 29/02 | (2006.01) |
| G11C 7/10 | (2006.01) |

(52) U.S. Cl.
CPC ................ *G11C 8/00* (2013.01); *G11C 29/025* (2013.01); *G11C 29/028* (2013.01); *G11C 7/1066* (2013.01); *G11C 7/1093* (2013.01); *G11C 2207/2254* (2013.01)
USPC ....................... 326/30; 365/233.16; 365/233.1

(58) Field of Classification Search
USPC ............................................................ 326/30
See application file for complete search history.

(56) References Cited

U.S. PATENT DOCUMENTS

| | | | |
|---|---|---|---|
| 7,495,468 B2 * | 2/2009 | You | 326/30 |
| 2008/0001622 A1 * | 1/2008 | You | 326/30 |

FOREIGN PATENT DOCUMENTS

KR              101062777 B1     8/2011

* cited by examiner

*Primary Examiner* — Daniel D Chang
(74) *Attorney, Agent, or Firm* — William Park & Associates Patent Ltd.

(57) ABSTRACT

An on-die termination circuit including: a DQS circuit block configured to terminate a DQS pad in response to a first impedance adjustment signal which is transmitted through a global line; and a DQ circuit block configured to terminate a DQ pad in response to a second impedance adjustment signal which is generated by changing the first impedance adjustment signal or a value of the first impedance adjustment signal depending on whether a setup operation proceeds.

18 Claims, 6 Drawing Sheets

FIG.2
(PRIOR ART)

| | ODT (or Dynamic ODT) | Read | | Write Leveling | |
|---|---|---|---|---|---|
| | | Ron=H(34Ω) | Ron=L(45Ω) | Ron=H(34Ω) | Ron=L(45Ω) |
| DQ | OCDT_DQ<0:2> => RTT | OCDT_DQ<0:2> = {H,H,H} | OCDT_DQ<0:2> = {H,L,H} | OCDT_DQ<0:2> = {H,H,H} | OCDT_DQ<0:2> = {H,L,H} |
| DQS | OCDT_DQS<0:2> => RTT | OCDT_DQS<0:2> = {H,H,H} | OCDT_DQS<0:2> = {H,L,H} | OCDT_DQS<0:2> => RTT | |

FIG.6

| | ODT(or Dynamic ODT) | Read | | Write Leveling | |
|---|---|---|---|---|---|
| | | Ron=H(34Ω) | Ron=L(45Ω) | Ron=H(34Ω) | Ron=L(45Ω) |
| DQ | OCDT2<0:2><br>=OCDT<0:2><br>= RTT | OCDT2<0:2><br>=OCDT<0:2><br>= {H,H,H} | OCDT2<0:2><br>=OCDT<0:2><br>= {H,L,H} | OCDT2<0:2><br>= {H,H,H} | OCDT2<0:2><br>= {H,L,H} |
| DQS | | | | OCDT<0:2> => RTT | |

ON-DIE TERMINATION CIRCUIT AND TERMINATION METHOD

CROSS-REFERENCES TO RELATED APPLICATION

The present application claims priority under 35 U.S.C. §119(a) to Korean application number 10-2012-0069156, filed on Jun. 27, 2012, in the Korean Intellectual Property Office, which is incorporated herein by reference in its entirety.

BACKGROUND

1. Technical Field

The present invention generally relates to a semiconductor circuit, and more particularly, to an on-die termination circuit and a termination method.

2. Related Art

With technological advancements, such as DDR, DDR2, DDR3 and the like, many functions are added to semiconductor circuits, and especially, to semiconductor memory circuits.

In addition, as the functions are added, control circuits for controlling the respective functions and numerous signals are added.

Such signal addition causes an addition in a global line which is disposed over the entire circuit area, and such an addition in the global line is also applied to on-die termination circuits.

As illustrated in FIG. 1, a conventional on-die termination circuit 1 includes an impedance adjustment unit 10, a plurality of DQ circuit blocks 20, a DQS circuit block 30, a DQSB circuit block 40, and a plurality of global lines 50.

The impedance adjustment unit 10 generates a first impedance adjustment signal OCDT_DQ<0:2> and a second impedance adjustment signal OCDT_DQS<0:2> in response to a write leveling signal WTLEV, impedance setup signals Ron and RTT, a read command Read, an on-die termination command ODT, and a dynamic on-die termination command DODT.

In this case, the first impedance adjustment signal OCDT_DQ<0:2> is used to adjust the impedances of the DQ pads of the DQ circuit block 20.

The second impedance adjustment signal OCDT_DQS<0:2> is used to adjust the impedances of the DQS pad of the DQS circuit block 30 and the DQSB pad of the DQSB circuit block 40.

The DQ circuit block 20 adjusts the impedance of the DQ pad in response to the first impedance adjustment signal OCDT_DQ<0:2> and the write leveling signal WTLEV.

The DQS circuit block 30 adjusts the impedance of the DQS pad in response to the second impedance adjustment signal OCDT_DQS<0:2> and the write leveling signal WTLEV.

The DQSB circuit block 40 adjusts the impedance of the DQSB pad in response to the second impedance adjustment signal OCDT_DQS<0:2> and write leveling signal WTLEV.

The plurality of global lines 50 includes six global lines for separately transmitting the first impedance adjustment signal OCDT_DQ<0:2> and the second impedance adjustment signal OCDT_DQS<0:2>, and one global line for transmitting the write leveling signal WTLEV.

Hereinafter, the termination operation of the conventional on-die termination circuit will be described with reference to FIG. 2.

When an on-die termination command ODT (or Dynamic ODT) is activated (On-Die Termination Operation), a first impedance adjustment signal OCDT_DQ<0:2> and a second impedance adjustment signal OCDT_DQS<0:2> have the same setup value.

Accordingly, the impedances of a DQ pad and a DQS pad (DQSB pad) are adjusted to the same value, that is to say, to an RTT.

When a read command Read is activated (Read Operation), the first impedance adjustment signal OCDT_DQ<0:2> and the second impedance adjustment signal OCDT_DQS<0:2> have the same value.

Accordingly, the impedances of the DQ pad and the DQS pad (DQSB pad) are adjusted to the same value, that is to say, to 34Ω (or 45Ω).

Depending on the value H or L of the impedance setup signal Ron, the value of the first impedance adjustment signal OCDT_DQ<0:2> can vary. In this case, the value of the second impedance adjustment signal OCDT_DQS<0:2> varies to the same value as the first impedance adjustment signal OCDT_DQ<0:2>.

That is to say, when Ron=H, the first impedance adjustment signal OCDT_DQ<0:2> and the second impedance adjustment signal OCDT_DQS<0:2> can have the value of H, H, and H.

Additionally, when Ron=L, the first impedance adjustment signal OCDT_DQ<0:2> and the second impedance adjustment signal OCDT_DQS<0:2> can have the value of H, L, and H.

Therefore, the DQ pad and DQS pad (DQSB pad) can be adjusted to 34Ω when Ron=H, and the DQ pad and DQS pad (DQSB pad) can be adjusted to 45Ω when Ron=L.

Additionally, when a write leveling signal WTLEV is activated (Write Leveling Operation), the first impedance adjustment signal OCDT_DQ<0:2> and the second impedance adjustment signal OCDT_DQS<0:2> have mutually different values.

That is to say, similarly to the read operation, the first impedance adjustment signal OCDT_DQ<0:2> can have the value of H, H, and H when Ron=H, and can have the value of H, L, and H when Ron=L.

Accordingly, the DQ pad can be adjusted to 34Ω when Ron=H, and the DQ pad can be adjusted to 45Ω when Ron=L.

Additionally, the second impedance adjustment signal OCDT_DQS<0:2> has a setup value, like on an on-die termination operation, so that the impedance of the DQS pad (DQSB pad) is adjusted to an RTT.

In this case, the write leveling operation is an operation for compensating for a mismatch of signal levels in a write operation, and can be performed according to a command of a controller which controls a semiconductor device.

As seen by FIG. 2, in a write leveling operation, the values of the first impedance adjustment signal OCDT_DQ<0:2> and the second impedance adjustment signal OCDT_DQS<0:2> are set to values different from each other.

Therefore, the conventional technique uses a total of seven global lines 50 (see FIG. 1, (#7)) on the assumption that each of the first impedance adjustment signal OCDT_DQ<0:2> and the second impedance adjustment signal OCDT_DQS<0:2> is configured with 3 bits.

That is to say, six global lines for separately transmitting the first impedance adjustment signal OCDT_DQ<0:2> and the second impedance adjustment signal OCDT_DQS<0:2>, and one global line for transmitting a write leveling signal WTLEV are required.

As described above, according to the conventional technique, the number of global lines disposed over the entire circuit area increases to support an on-die termination function including a write leveling, so that net die decreases.

SUMMARY

An on-die termination circuit capable of reducing the number of global lines and a termination method thereof are described herein.

In an embodiment, an on-die termination circuit includes: a DQS circuit block configured to terminate a DQS pad in response to a first impedance adjustment signal which is transmitted through a global line; and a DQ circuit block configured to terminate a DQ pad in response to a second impedance adjustment signal which is generated by changing the first impedance adjustment signal or a value of the first impedance adjustment signal depending on whether a setup operation proceeds.

In an embodiment, an on-die termination circuit includes: an impedance adjustment unit configured to generate a first impedance adjustment signal in response to a termination operation-related signal; a DQS circuit block configured to adjust the impedance of a DQS pad in response to the first impedance adjustment signal which is transmitted through a global line; a DQ circuit block configured to adjust the impedance of a DQ pad in response to a second impedance adjustment signal; and a control unit configured to generate the second impedance adjustment signal in response to an impedance setup signal Ron, a write leveling signal, and the first impedance adjustment signal.

In an embodiment, a termination method of an on-die termination circuit which supports a termination operation according to a DQ pad, a DQS pad, and a write leveling operation includes the steps of: transmitting an impedance adjustment signal to adjust a termination impedance of the DQS pad, through a global line; terminating the DQS pad to an impedance corresponding to the impedance adjustment signal; and terminating the DQ pad to an impedance corresponding to a signal value which is obtained by modulating the impedance adjustment signal according to whether the write leveling operation is performed.

BRIEF DESCRIPTION OF THE DRAWINGS

Features, aspects, and embodiments are described in conjunction with the attached drawings, in which:

FIG. 2 is a table illustrating DQ and DQS pads/impedance adjustment signal values according to a conventional termination operation;

FIG. 6 is a table illustrating DQ and DQS pads/impedance adjustment signal values in accordance with the termination operation of the on-die termination circuit according to an embodiment.

DETAILED DESCRIPTION

Before the detailed description of an embodiment is made, it should be noted that the impedances of DQ and DQS pads are adjusted to the same value in operations, except for a write leveling operation, as described above with respect to the conventional technique (see FIG. 2).

In this case, the DQ pad is a pad to input and output data, and the DQS pad is a pad to input and output a data strobe signal.

Therefore, according to an embodiment, one type of impedance adjustment signals may be transmitted through global lines, and the one type of impedance adjustment signals may be used with modulation or without change according to a write leveling function and an impedance setup signal Ron (i.e., on-state resistance) in a local region, that is to say, in a region adjacent to a DQ circuit block or in the DQ circuit block.

Hereinafter, an on-die termination circuit and a termination method according to various embodiments will be described below with reference to the accompanying drawings through the embodiments.

Figure 1:
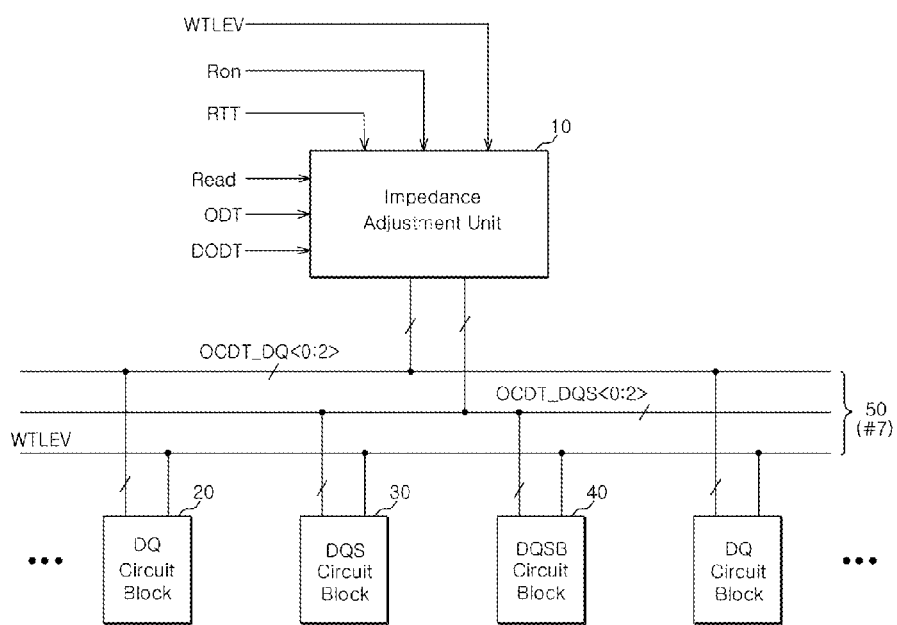
FIG. 1 is a block diagram illustrating a conventional on-die termination circuit 1.
Figure 3:
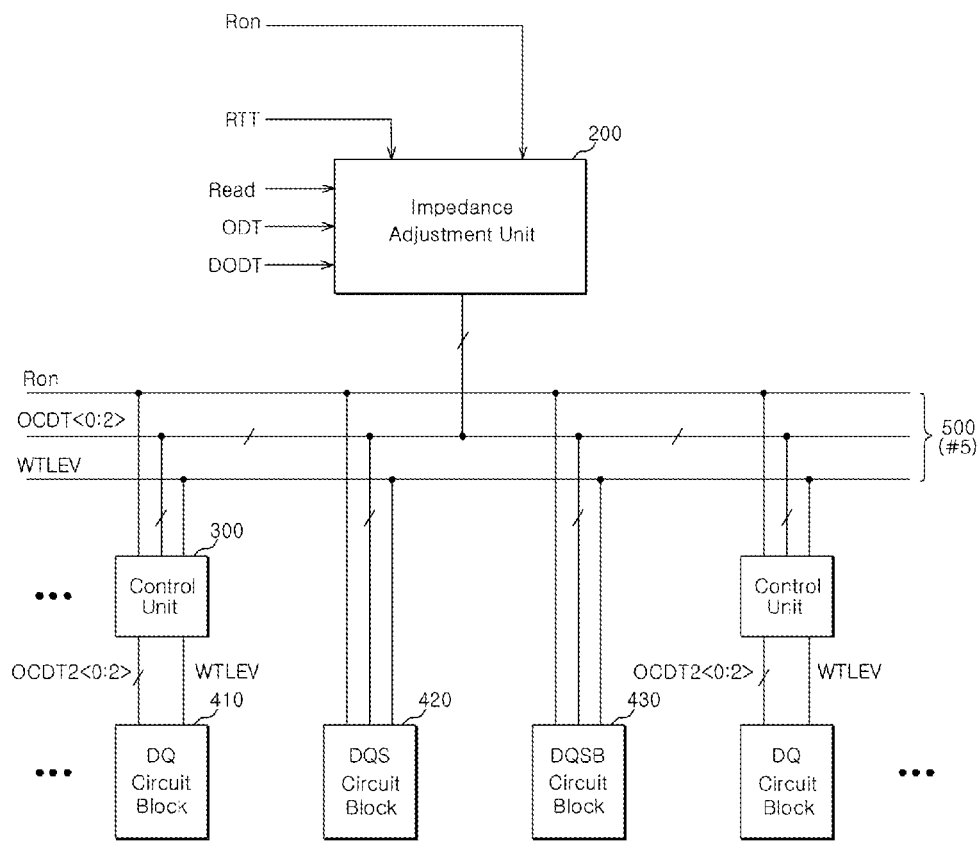
FIG. 3 is a block diagram illustrating an on-die termination circuit according to an embodiment.

As illustrated in FIG. 3, an on-die termination circuit 100 according to an embodiment may include an impedance adjustment unit 200, a plurality of DQ circuit blocks 410, a DQS circuit block 420, a DQSB circuit block 430, a control unit 300, and a plurality of global lines 500.

The impedance adjustment unit 200 can be configured to generate a first impedance adjustment signal OCDT<0:2> in response to a termination operation-related signal.

In this case, the termination operation-related signal can include impedance setup signals Ron and RTT, a read command Read, an on-die termination command ODT, and/or a dynamic on-die termination command DODT.

The control unit 300 may be configured to generate a second impedance adjustment signal OCDT2<0:2> in response to the impedance setup signal Ron, a write leveling signal WTLEV, and the first impedance adjustment signal OCDT<0:2>.

The control unit 300 may transmit the second impedance adjustment signal OCDT2<0:2> to the DQ circuit block 410 through a local line.

The DQ circuit block 410 may be configured to adjust the impedance of a DQ pad in response to the second impedance adjustment signal OCDT2<0:2>.

The DQ circuit block 410 can be configured to adjust the impedance of the DQ pad in response to the second impedance adjustment signal OCDT2<0:2> and the write leveling signal WTLEV.

The DQS circuit block 420 may be configured to adjust the impedance of a DQS pad in response to the impedance setup signal Ron and the first impedance adjustment signal OCDT<0:2>.

The DQS circuit block 420 can be configured to adjust the impedance of the DQS pad in response to the impedance setup signal Ron, the write leveling signal WTLEV, and the first impedance adjustment signal OCDT<0:2>.

The DQSB circuit block 430 may be configured to adjust the impedance of a DQSB pad in response to the impedance setup signal Ron and the first impedance adjustment signal OCDT<0:2>.

The DQSB circuit block 430 can be configured to adjust the impedance of the DQSB pad in response to the impedance setup signal Ron, the write leveling signal WTLEV, and the first impedance adjustment signal OCDT<0:2>.

Additionally, the control unit 300 can be included in the DQ circuit block 410.

The plurality of global lines 500 may include five global lines for transmitting the impedance setup signal Ron, the first impedance adjustment signal OCDT<0:2>, and the write leveling signal WTLEV.

Figure 4:
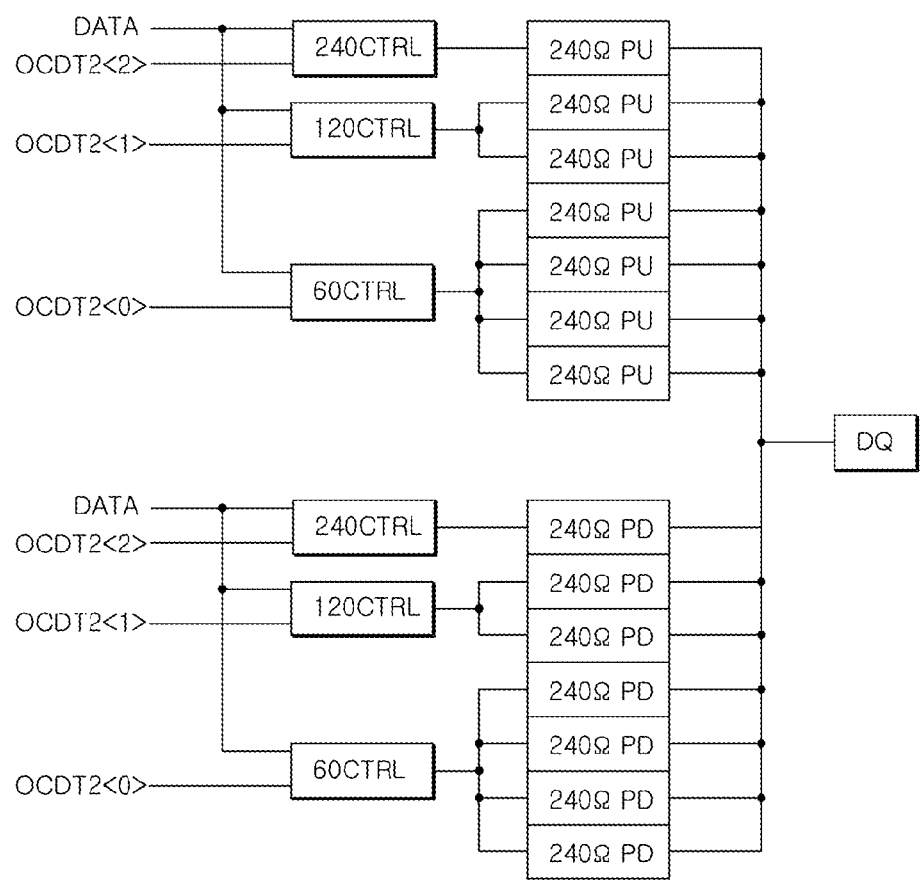
FIG. 4 is a block diagram illustrating the configuration of a partial circuit of a DQ circuit block shown in FIG. 3.

As illustrated in FIG. 4, the DQ circuit block 410 may include a plurality of control blocks 60CTRL, 120CTRL, and 240CTRL, a plurality of pull-up drivers 240Ω PUs and a plurality of pull-down drivers 240Ω PDs.

The DQ circuit block 410 may allow the plurality of control blocks 60CTRL, 120CTRL, and 240CTRL to activate pull-up drivers 240Ω PUs and pull-down drivers 240Ω PDs, corresponding to numbers allocated to the control blocks 60CTRL, 120CTRL, and 240CTRL, in response to the second impedance adjustment signal OCDT2<0:2> and data (i.e., DATA), thereby adjusting the impedance of a DQ pad (i.e., DQ).

For example, when output data according to a read operation is a high level H (i.e., voltage level or voltage logic level), and the second impedance adjustment signal OCDT2<0:2> is H, H, and H, the plurality of control blocks 60CTRL, 120CTRL, and 240CTRL activate all of seven pull-up drivers 240Ω PUs, thereby adjusting the impedance of the DQ pad to 34 Ω.

When output data according to a read operation is a low level L (i.e., voltage level or voltage logic level), and the second impedance adjustment signal OCDT2<0:2> is H, H, and H, the plurality of control blocks 60CTRL and 240CTRL activate five pull-down drivers 240Ω PDs, thereby adjusting the impedance of the DQ pad to 45 Ω.

Additionally, when output data according to a read operation is a low level L, and the second impedance adjustment signal OCDT2<0:2> is H, L, and H, the plurality of control blocks 60CTRL and 240CTRL activate five pull-down drivers 240Ω PDs, thereby adjusting the impedance of the DQ pad to 45 Ω.

Figure 5:
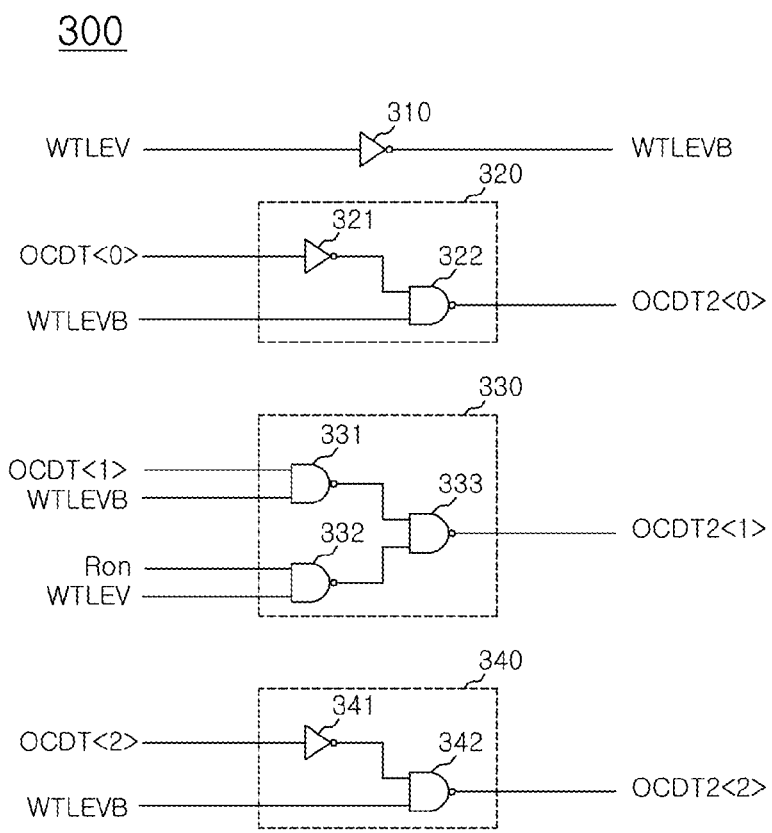
FIG. 5 is a circuit diagram illustrating a control unit shown in FIG. 3.

As illustrated in FIG. 5, the control unit 300 may be configured to output a first impedance adjustment signal OCDT<0:2> as a second impedance adjustment signal OCDT2<0:2> when a write leveling signal WTLEV is inactivated.

The control unit 300 may be configured, when the write leveling signal WTLEV is activated, to output a second impedance adjustment signal OCDT2<0:2> having a set value in response to an impedance setup signal Ron.

The control unit 300 may be configured to output a second impedance adjustment signal OCDT2<0:2> of "H, H, and H" when the write leveling signal WTLEV is activated, and the impedance setup signal Ron is a high level.

The control unit 300 may be configured to output a second impedance adjustment signal OCDT2<0:2> of "H, L, and H" when the write leveling signal WTLEV is activated, and the impedance setup signal Ron is a low level.

The control unit 300 may include a plurality of logic circuits 310 to 340.

The logic circuit 310 may include an inverter which inverts the write leveling signal WTLEV and generates a sub-write leveling signal WTLEVB.

The logic circuit 320 may include: an inverter 321 for receiving a first impedance adjustment signal bit OCDT<0>; and a NAND gate 322 for receiving the output of the inverter 321 and the sub-write leveling signal WTLEVB, and outputting a second impedance adjustment signal bit OCDT2<0>.

The logic circuit 330 may include: a NAND gate 331 for receiving a first impedance adjustment signal bit OCDT<1> and the sub-write leveling signal WTLEVB; a NAND gate 332 for receiving the impedance setup signal Ron and the write leveling signal WTLEV; and a NAND gate 333 for receiving the outputs of the NAND gates 331 and 332 and outputting a second impedance adjustment signal bit OCDT2<1>.

The logic circuit 340 may include: an inverter 341 for receiving a first impedance adjustment signal bit OCDT<2>; and a NAND gate 342 for receiving the output of the inverter 341 and the sub-write leveling signal WTLEVB, and outputting a second impedance adjustment signal bit OCDT2<2>.

Hereinafter, the termination operation according to an embodiment will be described with reference to FIG. 6.

When an on-die termination command ODT (or Dynamic ODT) is activated (On-Die Termination Operation), a first impedance adjustment signal OCDT<0:2> and a second impedance adjustment signal OCDT2<0:2> have the same setup value (see FIG. 5 and corresponding description).

Accordingly, the impedances of a DQ pad and a DQS pad (DQSB pad) are adjusted to the same value, that is to say, to an RTT (i.e., OCDT2<0:2>=OCDT<0:2>=RTT).

When a read command Read is activated (Read Operation), the first impedance adjustment signal OCDT<0:2> and the second impedance adjustment signal OCDT2<0:2> have the same value.

Accordingly, the impedances of the DQ pad and the DQS pad (DQSB pad) are adjusted to the same value, that is to say, to 34Ω (or 45Ω).

Depending on the value H or L of the impedance setup signal Ron, the value of the first impedance adjustment signal OCDT<0:2> can vary. In this case, the value of the second impedance adjustment signal OCDT2<0:2> varies to the same value as the first impedance adjustment signal OCDT<0:2>.

That is to say, when Ron=H, the first impedance adjustment signal OCDT<0:2> and the second impedance adjustment signal OCDT2<0:2> can have the value of H, H, and H.

Additionally, when Ron=L, the first impedance adjustment signal OCDT<0:2> and the second impedance adjustment signal OCDT2<0:2> can have the value of H, L, and H.

Therefore, the DQ pad and DQS pad (DQSB pad) can be adjusted to 34Ω when Ron=H, and the DQ pad and DQS pad (DQSB pad) can be adjusted to 45Ω when Ron=L.

Additionally, when a write leveling signal WTLEV is activated (Write Leveling Operation), the first impedance adjustment signal OCDT<0:2> and the second impedance adjustment signal OCDT2<0:2> have mutually different values.

That is to say, the first impedance adjustment signal OCDT<0:2> has a setup value, like on an on-die termination operation, so that the impedance of the DQS pad (DQSB pad) is adjusted to an RTT.

Similarly to the read operation, the first impedance adjustment signal OCDT<0:2> can have the value of H, H, and H when Ron=H, and can have the value of H, L, and H when Ron=L.

Accordingly, the DQ pad can be adjusted to 34Ω when Ron=H, and the DQ pad can be adjusted to 45Ω when Ron=L.

In this case, the write leveling operation is an operation for compensating for a mismatch of signal levels in a write operation, and can be performed according to a command of a controller which controls a semiconductor device.

In the conventional technique, six global lines are used to transmit the first impedance adjustment signal OCDT_DQ<0:2> and the second impedance adjustment signal OCDT_DQS<0:2>.

However, according to an embodiment, only the first impedance adjustment signal OCDT<0:2> is transmitted through global lines, and the second impedance adjustment signal OCDT2<0:2> are transmitted through local lines with respect to DQ circuit blocks only.

Therefore, according to an embodiment, on a write leveling operation, the impedances of the DQ pad and DQS (DQSB) pad can be controlled to have mutually different values, and the number of global lines for transmitting impedance adjustment signals can be reduced (i.e., FIG. 3, (#5)).

According to an embodiment, net die can increase through the reduction of global lines.

While various embodiments have been described above, it will be understood to those skilled in the art that the embodiments described are by way of example only. Accordingly, the device and method described herein should not be limited based on the described embodiments.

What is claimed is:

1. An on-die termination circuit, comprising:
a DQS circuit block configured to terminate a DQS pad in response to a first impedance adjustment signal which is transmitted through a global line; and
a DQ circuit block configured to terminate a DQ pad in response to a second impedance adjustment signal which is generated by changing the first impedance adjustment signal or a value of the first impedance adjustment signal depending on whether a setup operation proceeds.

2. The on-die termination circuit according to claim 1, wherein the DQS circuit block is configured to terminate the DQS pad in response to an impedance setup signal Ron, a write leveling signal, and the first impedance adjustment signal.

3. The on-die termination circuit according to claim 1, further comprising a control unit which is configured to generate the second impedance adjustment signal in response to an impedance setup signal Ron, a write leveling signal, and the first impedance adjustment signal.

4. The on-die termination circuit according to claim 3, wherein the control unit is configured to output the first impedance adjustment signal as the second impedance adjustment signal when the write leveling signal is inactivated.

5. The on-die termination circuit according to claim 3, wherein the control unit is configured to output the second impedance adjustment signal having a set value which is different from that of the first impedance adjustment signal when the write leveling signal is activated.

6. The on-die termination circuit according to claim 3, wherein the control unit is configured to output the second impedance adjustment signal having a set value which is different from that of the first impedance adjustment signal in response to the impedance setup signal Ron when the write leveling signal is activated.

7. An on-die termination circuit, comprising:
an impedance adjustment unit configured to generate a first impedance adjustment signal in response to a termination operation-related signal;
a DQS circuit block configured to adjust the impedance of a DQS pad in response to the first impedance adjustment signal which is transmitted through a global line;
a DQ circuit block configured to adjust the impedance of a DQ pad in response to a second impedance adjustment signal; and
a control unit configured to generate the second impedance adjustment signal in response to an impedance setup signal Ron, a write leveling signal, and the first impedance adjustment signal.

8. The on-die termination circuit according to claim 7, wherein the termination operation-related signal includes the impedance setup signal Ron, a read command, an on-die termination command, or a dynamic on-die termination command.

9. The on-die termination circuit according to claim 7, wherein the DQS circuit block is configured to adjust the impedance of the DQS pad in response to an impedance setup signal Ron, the write leveling signal, and the first impedance adjustment signal.

10. The on-die termination circuit according to claim 7, wherein the DQ circuit block is configured to adjust the impedance of the DQ pad in response to the write leveling signal and the second impedance adjustment signal.

11. The on-die termination circuit according to claim 7, wherein the control unit is configured to transfer the second impedance adjustment signal to the DQ circuit block through a local line.

12. The on-die termination circuit according to claim 7, wherein the control unit is configured to output the first impedance adjustment signal as the second impedance adjustment signal when the write leveling signal is inactivated.

13. The on-die termination circuit according to claim 7, wherein the control unit is configured to output the second impedance adjustment signal having a set value which is different from that of the first impedance adjustment signal when the write leveling signal is activated.

14. The on-die termination circuit according to claim 7, wherein the control unit is configured to output the second impedance adjustment signal having a set value which is different from that of the first impedance adjustment signal in response to the impedance setup signal Ron when the write leveling signal is activated.

15. A termination method of an on-die termination circuit which supports a termination operation according to a DQ pad, a DQS pad, and a write leveling operation, comprising the steps of:
transmitting an impedance adjustment signal to adjust a termination impedance of the DQS pad, through a global line;
terminating the DQS pad to an impedance corresponding to the impedance adjustment signal; and
terminating the DQ pad to an impedance corresponding to a signal value which is obtained by modulating the impedance adjustment signal according to whether the write leveling operation is performed.

16. The method according to claim 15, wherein, in the step of terminating the DQ pad, the DQ pad is terminated to an impedance corresponding to the impedance adjustment signal when the write leveling operation is not performed.

17. The method according to claim 15, wherein, in the step of terminating the DQ pad, the DQ pad is terminated to an impedance corresponding to a signal value which is obtained by modulating the impedance adjustment signal in response to an impedance setup signal Ron when the write leveling operation is performed.

18. The on-die termination circuit according to claim 1, wherein the setup operation includes a write leveling operation.

* * * * *